United States Patent
Tseng et al.

[11] Patent Number: 6,063,698
[45] Date of Patent: May 16, 2000

[54] METHOD FOR MANUFACTURING A HIGH DIELECTRIC CONSTANT GATE OXIDE FOR USE IN SEMICONDUCTOR INTEGRATED CIRCUITS

[75] Inventors: Hsing-Huang Tseng; Philip J. Tobin, both of Austin, Tex.

[73] Assignee: Motorola, Inc., Schaumburg, Ill.

[21] Appl. No.: 08/885,433

[22] Filed: Jun. 30, 1997

[51] Int. Cl.$^7$ ............................................. H01L 21/3205
[52] U.S. Cl. ..................... 438/585; 438/595; 438/709; 438/710; 438/660; 438/669; 438/715; 438/910
[58] Field of Search .................................. 438/585, 591, 438/594, 595, 709, 711, 712, 669, 660, 706, 710, 708, 715, 719, 910

[56] References Cited

U.S. PATENT DOCUMENTS

| | | | |
|---|---|---|---|
| 5,221,632 | 6/1993 | Kurimoto et al. | 438/595 |
| 5,545,578 | 8/1996 | Park et al. | 438/595 |
| 5,573,965 | 11/1996 | Jeng et al. | 438/595 |
| 5,637,514 | 6/1997 | Jeng et al. | 438/163 |
| 5,656,523 | 8/1997 | Wilhoit | 438/595 |
| 5,672,525 | 9/1997 | Pan | 438/591 |
| 5,707,901 | 1/1998 | Cho et al. | 438/595 |
| 5,763,922 | 6/1998 | Chau | 257/371 |
| 5,843,835 | 12/1998 | Liu | 438/585 |
| 5,858,843 | 1/1999 | Doyle et al. | 438/299 |
| 5,866,482 | 2/1999 | Lee | 438/720 |
| 5,923,056 | 7/1999 | Lee et al. | 257/192 |

OTHER PUBLICATIONS

Sano, et al., "High Quality SiO2/Si Interfaces of Poly–Crystalline Silicon Thin Film Transistors by Annealing in Wet Atmosphere", IEEE Electron Device Letters, vol. 16, No. 5, pp. 157–160 (1995).

Wang, et al., "Effects of Water Vapor Anneal on MIS Devices Made of Nitrided Gate Dielectrics", Symposium on VLSI Technology Digest of Technical Papers, Section 23.1, pp. 226–227 (1996).

*Primary Examiner*—Carl Whitehead, Jr.
*Assistant Examiner*—Khanh Duong
*Attorney, Agent, or Firm*—J. Gustav Larson

[57] ABSTRACT

A method for forming a gate dielectric (14b) begins by providing a substrate (12). A high K dielectric layer (14a) is deposited overlying the substrate (12). The dielectric layer (14a) contains bulk traps (16) and interface traps (18). A polysilicon gate electrode (20) is then patterned and etched overlying the gate dielectric (14a) whereby the plasma etching of the gate electrode (20) results in substrate plasma damage (22). A post gate wet oxidation process is performed between 750° C. and 850° C. to reduce plasma etch damage and trap sites (16, 18) in order to provide an improved gate dielectric (14b). Source and drain electrodes (30) are then formed within the substrate and laterally adjacent the gate electrode (20) to form a transistor device having more consistent threshold voltages, improved subthreshold slope operation, reduced gate to channel leakage, and improved speed of operation.

20 Claims, 2 Drawing Sheets

METHOD FOR MANUFACTURING A HIGH DIELECTRIC CONSTANT GATE OXIDE FOR USE IN SEMICONDUCTOR INTEGRATED CIRCUITS

FIELD OF THE INVENTION

The present invention relates generally to semiconductor manufacturing, and more particularly to forming a gate oxide for use in semiconductor integrated circuits (ICs).

BACKGROUND OF THE INVENTION

In the integrated circuit industry, the performance of electrical devices can be improved by increasing the capacitance between a gate electrode and a channel region. The common method by which this capacitance can be increased is to decrease the thickness of the gate dielectric to below 100 angstroms. Currently, in the industry, the thickness of gate oxides are rapidly approaching 40 angstroms in thickness and below. At this thickness and below, the use of silicon dioxide as a gate dielectric is limited. Once silicon dioxide is formed to a thickness of less than 40 angstroms, direct tunneling may occur through the gate dielectric to the channel region, thereby increasing leakage current associated with the gate electrode and the channel region, causing an increase in power consumption.

Since reducing the thickness of the gate dielectric inherently increases gate-to-channel leakage current, alternative methods have been sought to reduce this leakage current while maintaining thin $SiO_2$ equivalent thickness. One method investigated by the industry has been to use higher dielectric constant (high-k or high-$\epsilon$) materials as the gate dielectric material whereby the increased permitivity ($\epsilon$) of the material resultes in an increase in the gate-to-channel capacitance resulting in a higher performance electrical device. Note that the capacitance is $C=\epsilon A/t_{ox}$ wherein a gate dielectric having a higher $\epsilon$ allows for the use of thicker gate dielectrics (i.e., $t_{ox}$ greater than 40 angstroms) whereby greater capacitance and device speed is achieved with less leakage current. However, the use of high-k dielectrics for gate dielectric materials is disadvantageous in integrated circuits (ICs) because high dielectric materials contain greater number of bulk traps and interface traps than gate dielectrics made from thermally grown $SiO_2$. These traps adversely effect both subthreshold slope and threshold voltage ($V_t$) operation of electric devices. Therefore, the integrated circuit industry is seeking solutions to enable fabrication of an ultra thin, high-reliability, high-k gate dielectric, to form faster devices while minimizing the trap disadvantages discussed above.

The industry has first sought to improve gate dielectric performance by curing plasma etch damage which occurs within the substrate after plasma etching of a polysilicon gate electrodes. When a polysilicon gate electrode is patterned/etched using a plasma etch environment, the energized plasma environment results in plasma damage to the substrate which is in close proximity to the gate electrode region. By using a dry oxygen ($O_2$) reoxidation process, which oxidizes the damaged portion of the substrate and provides the necessary heat to heal the substrate damage, the plasma etch damage is removed from the transistor's active regions.

A dry reoxidation is preferred over wet reoxidation processing for this polysilicon reoxidation step for many reasons. First, wet oxidation has a different chemistry from dry oxidation whereby oxidation using wet techniques occurs at a rate which is faster than those using dry techniques. In other words, if a wet reoxidation process were used in the prior art, the polysilicon gate electrode would be consumed at a faster rate than if dry oxidation were used. The consumption of the polysilicon gate electrode will be further exacerbated if the doping concentration in the polysilicon gate is high. In addition, a higher oxidation rate will result in "bird's beaking" of the polysilicon gate electrode whereby the effective length ($L_{EFF}$) of the resulting transistor device may be adversely altered.

In addition, because wet oxidation results in a thicker oxide being formed over the polysilicon region, lightly doped drain (LDD) source and drain formations for the transistor may be displaced too far from a gate electrode edge, resulting in higher on resistance ($R_{on}$) for the transistor. Therefore, in summary, polysilicon reoxidation processing is performed using dry oxidation in the industry, and is not performed using a wet reoxidation environment.

The industry has attempted to use high-k dielectric materials or CVD silicon dielectrics to improve device speed and gate oxide integrity. A concern with the formation of high-k dielectrics and Chemical Vapor Deposition (CVD) silicon dioxide has been the formation of traps in the dielectric bulk and dielectric interface to the substrate. A proposed solution has been to limit the effects of these trap sites by annealing chemically vapor deposited (CVDed) dielectric materials in a wet environment. This process is taught by Sano, et al., in a paper entitled "High Quality $SIO_2$/SI Interfaces of Polycrystalline Silicon Thin Film Transistors by Annealing In Wet Atmosphere", IEEE Electron Device Letters, Vol. 16, No. 5, May 1995. In this paper, Sano teaches that an $SiO_2$ layer is chemical vapor deposited on a silicon-based material. This silicon dioxide ($SiO_2$) film is then annealed at a very low non-oxidizing temperature of 270° C. for a period of time to decrease the interface trap density between the silicon dioxide and the underlying silicon-based material This low temperature anneal, as taught by Sano, does nothing to correct plasma damage caused by the etching of the gate and dielectric material. Furthermore, Sano does not teach that the annealed $SiO_2$ is the gate dielectric of a bulk transistor device. In addition, Sano teaches the use of conventional silicon dioxide ($SiO_2$) which cannot progress below 40 angstroms in thickness without suffering high leakage current densities as discussed above. Therefore, Sano does not teach a method of forming a high dielectric constant gate dielectric having reduced trap sites and reduce substrate plasma damage.

In addition, the industry has attempted to create electrical devices having higher performance by utilizing higher dielectric materials, such as silicon nitride, as gate dielectrics. One such teaching is found by Wang, et al., in a paper entitled "Effects of Water Vapor Anneal on MIS Devices Made of Nitrided Gate Dielectrics", 1996 Symposium on VLSI Technology Digest of Technical Papers, 1996. Wang teaches two different embodiments. In a first embodiment, Wang teaches that silicon nitride is deposited to function as a gate dielectric. Directly after the silicon nitride deposition, a low temperature non-oxidizing annealing step is performed at 500° C. on the nitride layer. This anneal, while reducing trap sites within the nitride layer, will not repair plasma damage or perform any type of advantageous reoxidation process. After this anneal process, a metal gate is then formed by Wang.

In a second embodiment, as taught by Wang, the silicon nitride layer is formed first. After the nitride layer is formed, an aluminum metal gate is formed over the nitride gate dielectric. The formation of the aluminum gate is then followed by a wet anneal process at a low temperature of 520° C. It is not possible for Wang to perform an oxidation step to cure plasma damage, because of the fact that Wang has used a metal gate. At temperatures higher than 520° C., the aluminum gates would be destroyed, degraded, severely oxidized, or the like all of which are highly disadvantageous. Therefore, the teachings of Wang do little to reduce plasma damage and cannot be modified to reduce substrate plasma damage due to thermal constraints.

Therefore, the need exists for an improved gate dielectric for a polysilicon-gated transistor. The improved gate dielectric region having a high dielectric constant, reduced trap sites, and reduced substrate plasma damage, whereby threshold voltage and subthreshold slope are not adversely effected while an increase in current drive ($I_{ds}$) current is achieved. It would further be advantageous to integrate this process into current processes such that process complexity is not increased and thermal budget is not affected.

Figure 1:
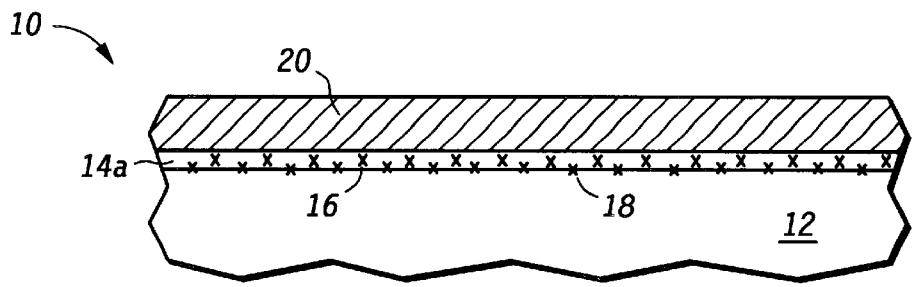
FIG. 1 illustrates, in a cross-sectional diagram, the deposition of a high-k dielectric followed by the deposition of polysilicon in accordance with the present invention.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Generally, the present invention is an improved method for forming an enhanced gate dielectric for a semiconductor device. A substrate is provided whereby a high-k dielectric is deposited onto the substrate. The high-k dielectric is generally formed by a CVD process and therefore contains bulk traps within the bulk of the dielectric material and interface traps at the interface between the substrate and the deposited material. A polysilicon layer is then deposited overlying the high-k dielectric layer. A reactive ion etch (RIE) is used to plasma etch the polysilicon layer to form patterned gate electrode region. The plasma etching of the gate electrode region will damage portions of the substrate thereby creating plasma damaged regions of the substrate adjacent the gate electrode. A wet oxidation process is then utilized to simultaneously oxidize the substrate and provide heat to the substrate to repair or remove the plasma etch damage. The wet oxidation will also reduce (i.e., make inactive) the bulk traps and interface traps associated with the high-k dielectric layer, whereby an improved gate dielectric is formed.

The wet oxidation is formed using a lower temperature than is conventionally accepted in the industry and uses specific hydrogen concentrations, whereby the benefit of reducing substrate plasma damage, reducing trap bulk sites in the gate dielectric, and reducing interface trap sites in the gate dielectric are realized. Therefore, the gate dielectric taught herein will have improved threshold voltage standard deviations, improved subthreshold slope characteristic, improved source-to-drain current gain whereby electrical device speed is enhanced, and improved leakage current through the gate dielectric between the gate electrode and a channel region in the substrate. In addition, all of the plasma damage repair and trap reduction is done in a single anneal/oxidation step unlike the multiple processing steps done in the prior art. Due to this one-step oxidation/anneal, the process complexity and thermal budget is reduced using the process taught herein.

The invention can be further understood with reference to FIGS. 1–4.

FIG. 1 illustrates a semiconductor device 10. In FIG. 1, a semiconductor substrate 12 is provided. Semiconductor substrate 12 is preferably a silicon wafer, however, semiconductor substrate 12 may be a germanium substrate, a germanium-silicon substrate, a gallium arsenide substrate, a silicon on insulator (SOI) substrate, a thin film transistor array, a flat panel display substrate, and/or like substrate materials.

A high-k dielectric material 14a is then deposited overlying the substrate 12. A preferred method for depositing the high-k dielectric 14a is jet vapor deposition (JVD). However, other forms of chemical vapor deposition (CVD) may be utilized as well as physical forms of depositions, such as sputtering, in order to form the layer 14a. The $SiO_2$ equivalent thickness of the layer 14a will typically be less than 40 angstroms. The SiO equivalent thickness of a material X is measured by determining the C-V method by replacing the permitivity value of the high k dielectric with the permitivity value of $SiO_2$. This method would result in a high k dielectric with an actual thickness of approximately 60 angstroms having an $SiO_2$ equivalent thickness of approximately 20 angstroms, where the high-k dielectric material has a permittivity three times greater than silicon dioxide, and assuming there is no interface $SiO_2$ between the silicon substrate and the high-k dielectric. Typically the physical thickness of the dielectric material 14a is on the order of 40–500 angstroms with roughly 40–100 angstroms being optimal. Experimentation has shown that physical deposition thicknesses of JVD silicon nitride within the range of 30–50 angstroms for the high-k dielectric film 14a are possible and technically feasible.

Typical materials which can be used to form the layer 14a include silicon nitride, metal oxides (such as tantalum pentoxide ($Ta_2O_5$) and titanium oxide ($TiO_2$)), ferroelectric materials and like dielectric materials or composites thereof. In particular, any dielectric layer can be used as dielectric 14a as long as the relative dielectric constant $\epsilon$ is roughly equal to 5 or greater.

As illustrated in FIG. 1, deposited oxide layers formed over a substrate 12 contain bulk traps 16 and interface traps 18. A trap 16 or trap 18 is an imperfect chemical bond between atoms in the atomic structure of the layer 14a or in the atomic interface between the substrate 12 and the layer 14a. Traps are disadvantageous in general, and particularly disadvantageous and numerous in high-k dielectric materials because they readily trap charge particles (such as electrons and/or holes) whereby the threshold voltage ($V_t$) of transistors can be adversely shifted or the subthreshold slope characteristic of transistor devices can be altered adversely. In addition, the presence of the traps 16 and 18 within the dielectric layer 14a can increase the leakage current between the layer 20 and the substrate 12. Increased leakage current between the layer 20 and the substrate 12 in FIG. 1 will increase the power consumption of electric device within the system and may decrease device performance. Therefore, subsequent processing taught herein is utilized to reduce either the number, or the effect, of these trap sites 16 and 18 whereby an improved gate dielectric is produced.

FIG. 1 illustrates that a conductive layer 20 is formed overlying the dielectric layer 14a. The conductive layer 20 is preferably a polysilicon layer, but can also be any silicon comprising layer such as silicon germanium or amorphous silicon. In other forms, the layer 20 can be formed by numerous deposition steps whereby a composite conductive layer is formed. Layer 20 can be capped by silicon nitride layers or like etch stop and anti-reflective coating (ARC) layers or may be optionally silicided. A rough optimal thickness of the layer 20 is about 2,000 angstroms. Layer 20 is typically in situ doped, ion implanted, or thermally diffused with dopant atoms. Depending upon the technology, these dopant atoms include phosphorus, arsenic, antimony, boron, and like dopant atoms.

Figure 2:
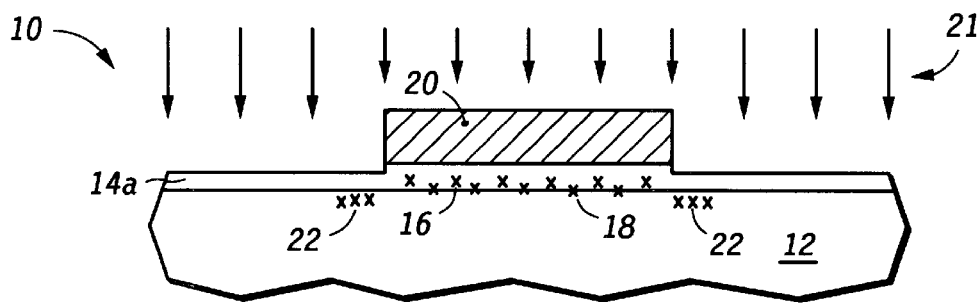
FIG. 2 illustrates, in a cross-sectional diagram, plasma etching of a gate electrode which results in a plasma etch damage in accordance with the present invention.

In FIG. 2, a photoresist mask (not specifically illustrated in FIG. 2) is formed and developed overlying the conductive layer 20. After the photoresist mask (not illustrated in FIG. 2) is formed in FIG. 2, the semiconductor device 10 is exposed to a plasma etch environment. In a preferred form, this plasma environment is a reactive ion etch (RIE) environment. In one form, the plasma etch environment 21 is a plasma supplied with a fluorine containing chemical such as $NF_3$ or $CF_4$. The selectivity between the etch chemistry 21 and the oxide 14a is such that a small top portion of exposed regions of the layer 14a is slightly consumed by the plasma environment 21.

FIG. 2 illustrates substrate plasma etch damage 22. The substrate plasma etch damage 22 is most severe below the edge of the patterned gate electrode 20 and within the substrate 12. The plasma damage 22 is atomic portions of the silicon substrate which have either been mechanically and/or electrically altered by exposure to the highly energized plasma environment 21. Therefore, the device illustrated in FIG. 2 contains plasma etch damage 22, bulk trap sites 16 within the dielectric 14a, and interface trap sites 18 at the interface between the layer 14a and the substrate 12. In order to reduce leakage current between the gate electrode 20 and the substrate 12, control voltage threshold shifting, improve subthreshold slope characteristics, and improve the source-to-drain current of transistor devices, the trap sites 18 and 16 must be inactivated while the plasma etch damage 22 is also substantially repaired.

Figure 3:
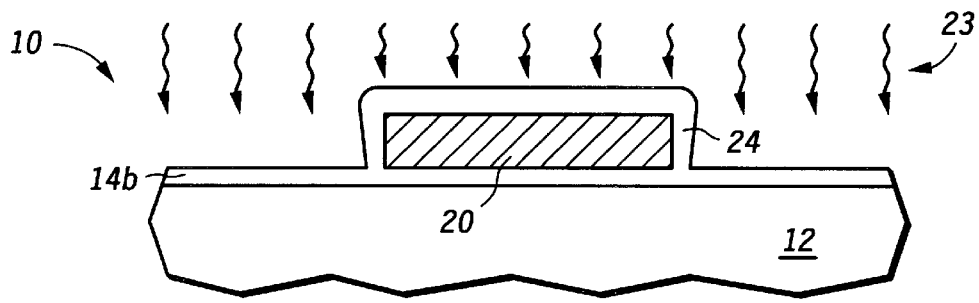
FIG. 3 illustrates, in a cross-sectional diagram, a wet anneal process used to correct plasma damage and traps within the gate dielectric in accordance with the present invention.

FIG. 3 illustrates that the substrate 12, the layer 14a, and the gate electrode 20 are exposed to an oxidizing ambient 23. In a preferred form, the oxidizing ambient 23 is a wet oxidation ambient which is supplied with both $O_2$ gas and $H_2$ gas. The wet oxidation environment 23 is provided to the wafer at a temperature between roughly 750° C. to 850° C. Optimally, an environment temperature of roughly 800° C. is maintained during wet oxidation exposure of the device 10. The typical time of exposure for the environment 23 is preferably 15 minutes. However, the time of exposure to the environment 23 may be changed to a length of time between 10 minutes and 1 hour. The exposure to the wet oxidation environment 23 will result in oxidation consumption of a thin upper portion of the substrate 12 which underlies the oxide 14b and is not underlying the electrode 20. Typically, the environment 23 results in roughly 50 angstroms to 100 angstroms of oxide growth onto this portion of substrate surface 12. Substrate areas protected by the polysilicon gate electrode 20 will not thermally grow at all or will thermally grow at a rate substantially reduced from the thermal oxidation rate of exposed portions of the substrate 12. Therefore, the thermal oxidation of the substrate 12 will consume, via substrate oxidition, some portion of the etch damage 22 illustrated previously in FIG. 2. In addition to the oxidation consumption of the plasma etch damage 22, the 750° C. to 850° C. thermal range of operation of the environment 23 will allow for heat annealing of the plasma etch damage 22. Between the heat and thermal oxidation of the substrate 12 due to the environment 23, a substantial portion of the plasma damage 22 from FIG. 2 will be repaired or removed from the final transistor device.

In addition to a slight oxidation of the substrate 12, exposed portions of the polysilicon gate which are not protected by nitride etch stops, silicide regions, ARC layers, or like layers will be oxidized via the environment 23. Therefore, FIG. 3 illustrates that a thin oxide layer 24 will be formed overlying the gate electrode 20. Note that the doped polysilicon will oxidize at a faster rate than the substrate 12 in FIG. 3. A low temperature wet oxidation is performed whereby temperatures are kept lower than 900° C. so that the thermal oxidation rate of the polysilicon gate electrode is not excessive. This lower temperature environment 23 ensures that the thickness of the dielectric 24 over the gate electrode 20 is relatively thin, whereby consumption of the polysilicon electrode 20 is minimized. In addition, the reduction in the temperature of the environment 23 to below 900° C. will ensure that polysilicon bird's beak along the interface between the polysilicon gate electrode 20 and the oxide 14b of FIG. 3 is reduced to an acceptable level. Therefore, the effective length ($L_{eff}$) of the final transistor device should not be adversely affected by the lower temperature oxidation process 23 taught herein.

In addition to curing the plasma damage 22 and in addition to reducing adverse affects of rapid polysilicon oxidation, the environment 23 is used to neutralize or inactivate the trap sites 16 and 18 of layer 14a which are illustrated in FIGS. 1–2. The wet environment 23 is supplied with both molecular oxygen ($O_2$) and molecular hydrogen ($H_2$) gas sources. This $O_2$ and $H_2$ gas supply will ensure that the environment 23 contains atomic hydrogen, hydrogen-peroxide (OH), atomic oxygen and like species. These species will readily diffuse to trap sites and eradicate trap sites 16 and 18 which are located in exposed portions of the dielectric 14 as well as within the dielectric layer portion 14 which directly underlies the gate electrode 20. This inactivation of some or a substantial portion of the trap sites 16 and 18 will reduce threshold voltage shifts, improve subthreshold slope transistor characteristics, reduce leakage current between the gate 20 and the substrate 12, and improve the current between the source and drain region as illustrated in FIG. 4 herein.

In a preferred embodiment, the Mass Flow Controller (MFC) for $O_2$ is 20 Standard Liters per Minute (SLM), while the MFC for $H_2$ is 10 (SLM). The percentage of $H_2$ in the $O_2$ and $H_2$ mixture approximately 6%, however a range of approximately 3% to 9% is expected to obtain comprable results.

In addition to performing a wet anneal using the environment 23, a nitrogen-containing gas may also be provided to the environment 23. The nitrogen containing gas may be supplied to the environment 23 throughout the wet oxidation process, or may be supplied to the wafer only during a select subportion of the oxidation process. These nitrogen containing gases include $N_2O$, $N_2$, $NH_3$, and NO. In one form, a brief time period of the oxidation process may be modified to accommodate the nitrogen annealing. To do so, either before, during, or after the application of the oxidation environment 23, the nitrogen-containing gas is applied to the wafer and the chamber temperature is changed from the 750° C. to 850° C. temperature range to a temperature range about 1,000° C. At these elevated temperatures, the wet oxidation gas flow may be reduced or fully terminated to avoid excessive oxidation. During this higher temperature period, the nitrogen-comprising gas can be increased or begun to further reduce trap sites 16 and 18 within the gate dielectric 14. The resultant dielectric layer 14b of FIG. 1 is improved over the dielectric region 14a of FIG. 2 in that the trap sites 16 and 18 have been reduced and plasma damage 22 has also been reduced. In addition, the final presence of nitrogen at the interface of the substrate in the dielectric layer 14b of FIG. 3 will reduce damaging hot carrier injection (CHI) between the gate electrode 20 and the substrate 12.

Figure 4:
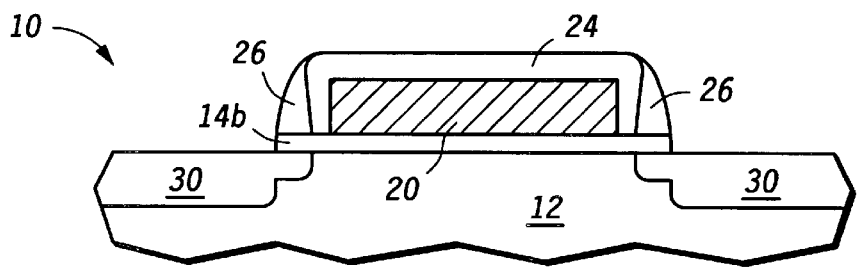
FIG. 4 illustrates, in a cross-sectional diagram, the placement of source and drain electrodes in accordance with the present invention.

FIG. 4 illustrates that a silicon nitride spacer 26 is formed in order to enable the formation of lightly doped drain (LDD) source and drain regions 30. After formation of these source and drain regions 30 and the nitride spacer 26, exposed portions of the dielectric layer 14b are exposed to an etch process. Therefore, FIG. 4 illustrates the formation of a fully functional transistor device having current electrodes 30 and a gate electrode 20. Note that the transistor device 20 has an improved gate dielectric 14b which has a high dielectric constant, reduced trap sites, and reduced plasma damage which is accomplished via a single anneal/oxidation process which simplifies the manufacturing flow and does not add to the existing thermal processing budget.

Figure 5:
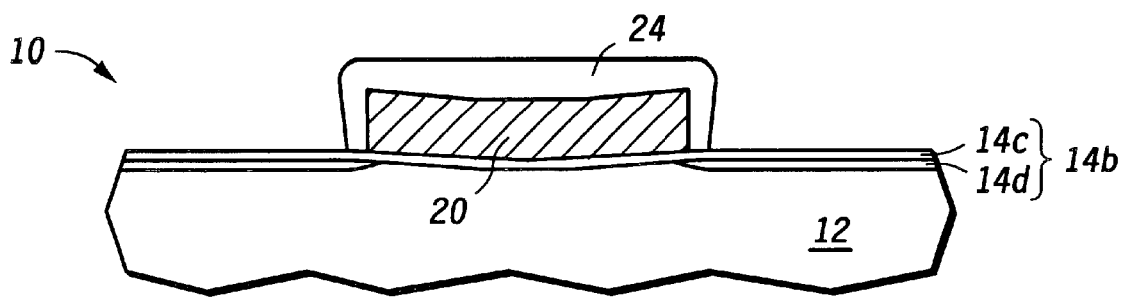
FIGS. 5–6 illustrate, in a cross-sectional diagrams, a detailed illustration of a transistor device having a composite dielectric stack formed via the wet anneal process of FIG. 3 in accordance with the present invention.
Figure 6:
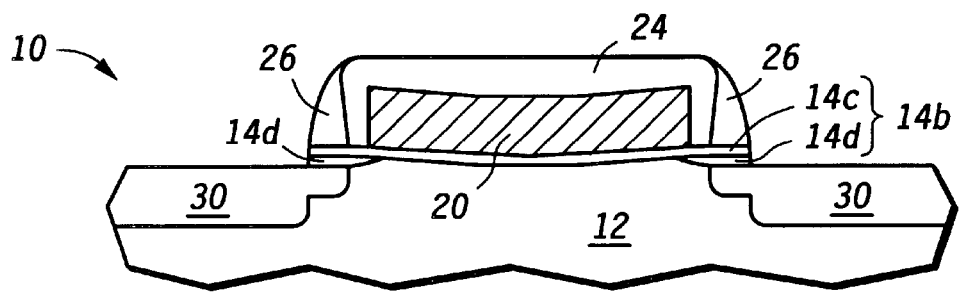

FIGS. 5–6 illustrate a specific composite gate dielectric structure which may result from the processing taught in FIGS. 1–4. FIGS. 4–5 illustrate the composite structure 14c/14d which is equivalent to the gate dielectric layer 14b of FIGS. 3–4 in one specific embodiment of the present invention. In FIG. 5, the environment 23 has been applied to a device wherein the device comprises a silicon wafer 12, a JVD silicon nitride layer 14c of roughly 30–50 angstroms in physical thickness, and a polysilicon gate electrode 20. The wet 750° C.–850° C. environment 23 creates the oxide region 24 on the polysilicon gate 20 as taught herein via thermal oxidation. However, for thin nitride layers 14c, the environment 23 will cause oxygen to diffuse through the nitride layer 14c and begin to slowly oxidize the surface of the substrate to form a thin thermal oxide layer 14d as in FIG. 5. Note that the thermal oxidation which forms the region 14d cannot occur to the substrate material under the gate electrode 20, therefor, the channel region operation of the transistor is not substantially affected. However, the presence of the gate-peripheral oxide portion 14d underlying the nitride region 14c may offer Miller capacitance performance improvement to transistor devices.

FIG. 6 illustrates that a sidewall spacer 26 is used to form LDD regions 30 wherein the composite region of 14c and 14d will remain in the final device under the LDD spacer 30 and laterally adjacent the edge of the gate electrode 20 to aid in Miller capacitance. As is also known in the art, silicon nitride directly in contact with silicon material may cause stress problems in the final device. However, with the formation of the layer 14d under larger portions of the layer 14c, this stress can be reduced. Even if the region 14c where a metal oxide, the thermal $SiO_2$ layer 14d resulting from the environment 23 applied to the device of FIG. 5 may improve stress between the substrate 12 and the metal oxide layer 14d. In addition, the presence of the wet-oxidized layer 14d between the regions 30 and the gate 20 may reduce the damaging effects of hot carrier injection (HCI) as is known to be the case for wet oxides.

Although the invention has been described and illustrated with reference to specific embodiments, it is not intended that the invention be limited to those illustrative embodiments. Those skilled in the art will recognize that modifications and variations may be made without departing from the spirit and scope of the invention. For example, furnace oxidation can occur in the presence of $O_2$ along with a slight flow of HCl which will effect oxidation rates. Therefore, it is intended that this invention encompass all of the variations and modifications as fall within the scope of the appended claims.

What is claimed is:

1. A method for forming a semiconductor structure, the method comprising the steps of:

providing a substrate having a surface;

forming a high-k dielectric layer over the substrate, the high-k dielectric layer having bulk traps and interface traps;

forming a gate layer over the high-k dielectric layer;

etching the gate layer in a plasma environment to form a gate region, wherein the step of etching causes a plasma etch damage in the substrate; and performing a low temperature wet oxidation step to inactivate the bulk traps and interface traps associated with the high-k dielectric layer, and to reduce the plasma etch damage.

2. The method of claim 1, wherein the step of forming the high-k dielectric layer comprises:

using a chemical vapor deposition (CVD) process to form the high-k dielectric layer.

3. The method of claim 2, wherein the step of forming a high-k dielectric layer comprises:

forming the high-k dielectric layer with a relative permitivity of greater than approximately 5.

4. The method of claim 2, wherein the step of forming the high-k dielectric layer comprises:

using a jet vapor deposition process as the CVD process to form the high-k dielectric layer.

5. The method of claim 1, wherein the step of forming the high-k dielectric layer comprises:

using a sputtering process to form the high-k dielectric layer.

6. The method of claim 1, wherein the step of forming the high-k dielectric layer comprises:

forming the high-k dielectric layer having an SiO2 equivalent thickness of less than approximately 40 angstroms.

7. The method of claim 1, wherein the step of forming the high-k dielectric layer comprises:

forming the high-k dielectric layer to include an oxide.

8. The method of claim 7, wherein the step of forming the high-k dielectric layer comprises:

forming the high-k dielectric layer to further include silicon nitride.

9. The method of claim 7, wherein the step of forming the high-k dielectric layer comprises:
   forming the high-k dielectric layer wherein the oxide is a metal oxide.

10. The method of claim 9, wherein the step of forming the high-k dielectric layer comprises:
    forming a Titanium oxide as the metal oxide.

11. The method of claim 9, wherein the step of forming the high-k dielectric layer comprises:
    forming a Tantalum oxide as the metal oxide.

12. The method of claim 1, wherein the step of performing the low temperature wet oxidation comprises:
    performing the low temperature wet oxidation step at a temperature in a range of approximately 750° to 850° Celsius.

13. The method of claim 1, wherein the step of performing the low temperature wet oxidation comprises:
    introducing approximately 3 to 9 molecular percentage of hydrogen to oxygen.

14. The method of claim 1, wherein the step of etching the gate layer further includes etching the gate layer using a reactive ion etch (RIE).

15. The method of claim 1, wherein the step of forming a high-k dielectric layer comprising:
    forming the high-k dielectric layer to have a relative permitivity of greater than approximately 8.

16. The method of claim 1, further comprising a step of:
    performing an anneal that includes Nitrogen.

17. The method of claim 16, wherein the step of peforming the anneal comprises:
    performing the anneal in situ with the low temperature wet oxidation step.

18. A method for forming a semiconductor structure, the method comprising the steps of:
    providing a substrate having a surface;
    forming a dielectric layer over the substrate using a chemical vapor deposition (CVD), wherein a the CVD process causes a formation of bulk traps and interface traps;
    forming a gate layer over the dielectric layer;
    etching the gate layer and the dielectric layer in a plasma environment to form a gate region, wherein the plasma environment at least partially causes a first leakage current between the gate and the substrate; and
    performing a low temperature wet oxidation to reduce the bulk traps and interface traps, wherein there is a second leakage current between the gate and substrate following the step of performing a low temperature wet oxidation and the second leakage current is less than the first leakage current.

19. A method for forming a semiconductor structure, the method comprising the steps of:
    forming a dielectric layer having an oxide equivalent thickness of less than approximately 40 Angstroms over a semiconductor substrate;
    forming a gate layer;
    etching the gate layer and the dielectric layer, by a plasma etch process, to form a patterned gate structure;
    placing the semiconductor substrate in an oxidation chamber;
    heating the oxidation chamber to approximately 750° to 850° Celsius;
    introducing oxygen into the oxidation chamber;
    introducing a diluted amount of hydrogen into the oxidation chamber at a substantially same time as the oxygen; and
    maintaining 750° to 850° Celsius in the oxidation chamber for approximately 15 minutes.

20. The method of claim 19,
    the oxygen is introduced at a rate of 20 standard liters per minute (SLM); and
    the diluted amount of hydrogen is introduce at a rate of 10 SLM.

* * * * *